United States Patent
Kushitani et al.

(10) Patent No.: US 6,577,208 B2
(45) Date of Patent: Jun. 10, 2003

(54) RADIO FREQUENCY FILTER

(75) Inventors: Hiroshi Kushitani, Osaka (JP); Masaaki Katsumata, Osaka (JP); Masayuki Mizuno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/085,998

(22) Filed: Feb. 26, 2002

(65) Prior Publication Data

US 2002/0145487 A1 Oct. 10, 2002

(30) Foreign Application Priority Data

Feb. 26, 2001 (JP) ........................................ 2001-049916

(51) Int. Cl.[7] ................................................ H03H 7/01
(52) U.S. Cl. ........................ 333/174; 333/175; 333/185
(58) Field of Search ................................. 333/175, 174, 333/184, 185, 204, 205, 219, 235

(56) References Cited

U.S. PATENT DOCUMENTS

| | | | | |
|---|---|---|---|---|
| 4,157,517 A | * | 6/1979 | Kneisel et al. | 333/205 |
| 4,706,050 A | * | 11/1987 | Andrews | 333/205 |
| 5,101,182 A | * | 3/1992 | Babbitt et al. | 333/205 |
| 5,400,000 A | * | 3/1995 | Okamura et al. | 333/175 |
| 5,952,901 A | | 9/1999 | Nakano | |
| 5,965,494 A | | 10/1999 | Terashima et al. | |
| 6,051,448 A | * | 4/2000 | Hayama et al. | 438/108 |
| 6,075,713 A | * | 6/2000 | Lee et al. | 361/821 |
| 6,115,234 A | * | 9/2000 | Ishii et al. | 361/303 |
| 6,166,613 A | * | 12/2000 | Nakagawa et al. | 333/205 |
| 6,170,154 B1 | * | 1/2001 | Swarup | 29/830 |
| 6,437,665 B1 | * | 8/2002 | Kato | 333/185 |
| 6,448,873 B1 | * | 9/2002 | Mostov | 333/185 |

OTHER PUBLICATIONS

W. Roshen, "Effect of Finite Thickness of Magnetic Substrate on Planar Inductors," *IEEE Transactions On Magnetics*, Jan., 1990, vol. 26, No. 1, pp. 270–275.

S. Gevorgian et al., "CAD Models for Multilayered Substrate Interdigital Capacitors", *IEEE Transactions On Microwave Theory and Techniques*, Jun., 1996, vol. 44, No. 6, pp. 896–904.

European Search Report, application No. 02004140.6, dated Jul. 2, 2002.

* cited by examiner

*Primary Examiner*—Seungsook Ham
(74) *Attorney, Agent, or Firm*—RatnerPrestia

(57) ABSTRACT

Disclosed is a radio frequency filter used for a mobile communication apparatus such as a mobile phone, having an inductor component, a capacitor component, and a resistor component formed of a conductor pattern. The filter includes the conductor pattern formed on the surface of dielectric layer, and an adjusting layer for adjusting the frequency characteristic of the filter formed so as to cover at least a part of the conductor pattern. In the radio frequency filter, the conductor pattern is formed and sintered, followed by adjusting the frequency characteristic of the filter. Accordingly, in the radio frequency filter, the yield of the manufacture is improved. Further, the electrode layer can be single-layered by using extra-thin lines for the conductor pattern and interdigital electrodes for the capacitor. As a result, it is possible to make the filter smaller and thinner by using intaglio-printing technique and thin-film forming technique.

11 Claims, 6 Drawing Sheets

RADIO FREQUENCY FILTER

FIELD OF THE INVENTION

The present invention mainly relates to a radio frequency filter used for mobile communication equipment such as a mobile phone.

BACKGROUND OF THE INVENTION

Recently, with the increase in needs for mobile communications equipment such as a mobile phone, the frequency band used for them has become insufficient in band width, giving rise to a trend of shifting to a higher frequency band. Accordingly, it is necessary for mobile communication equipment such as mobile phones to be compatible with a higher frequency. Above all, radio frequency filters used for them are becoming less in relative band width, and their component circuit elements are required to ensure higher dimensional accuracy.

A conventional radio frequency filter generally has a structure as shown in FIG. 5. The structure is as follows:

(1) First ground electrode 502 is formed on the top surface of first dielectric layer 501, and second dielectric layer 503 is laminated on ground electrode 502.

(2) Two resonator electrodes 504a and 504b are formed on the top surface of dielectric layer 503, and third dielectric layer 505 is laminated on resonators 504a and 504b.

(3) First transmission electrode 506a, second transmission electrode 506b, third transmission electrode 506c, first capacitor electrode 507a and second capacitor electrode 507b are formed on the top surface of dielectric layer 505, and fourth dielectric layer 508 is laminated on these electrodes.

(4) Second ground electrode 509 is formed on the top surface of dielectric layer 508, and fifth dielectric layer 510 is laminated on ground electrode 509.

(5) Terminal electrodes 511a, 511b, 511c, 511d are formed on the side surface of dielectric layer 510.

Here, resonator electrode 504a and capacitor electrode 507a, and resonator electrode 504b and capacitor electrode 507b are respectively disposed so as to be at least partly opposed to each other via dielectric layer 505. As shown in FIG. 5, transmission electrode 506a, capacitor electrode 507a, transmission electrode 506b, capacitor electrode 507b and transmission electrode 506c are formed in order between terminal electrodes 511c and 511d, thereby forming a transmission line. In addition, terminal electrode 511a is connected to ground electrodes 502 and 509 for the purpose of grounding. Further, terminal electrode 511b is connected to ground electrodes 502 and 509, and to each end of resonator electrodes 504a and 504b for the purpose of grounding.

In a conventional radio frequency filter having a structure as described above, resonator electrodes 504a and 504b are of triplate structure sandwiched between two ground electrodes 502 and 509. Resonator electrodes 504a and 504b, one end of each electrode being grounded, operate as a quarter-wavelength resonator, that is, as a serial resonator. Moreover, these resonators are partly opposed to capacitors 507a and 507b respectively via dielectric layer 505, and operate as a parallel-plate capacitor. More specifically, two serial resonators with one end grounded are connected in shunt to the transmission line between terminal electrodes 511c and 511d via the parallel-plate capacitor. Accordingly, this filter operates as a band-stop filter having terminal electrodes 511c and 511d as input terminal and output terminal respectively.

In a conventional radio frequency filter having the structure and operation as described above, each electrode is formed by a plurality of electrode layers having predetermined dimensions inside dielectric layers. After the electrode layer forming process followed by a dielectric layer sintering process, a filter having a predetermined frequency characteristic is selected by measurement. However, as recent equipment becomes higher in frequency, causing the relative bandwidth of frequency characteristic of the filter to become narrower, electrode layers are required to ensure higher dimensional accuracy. Thus it is difficult for such conventional forming process to ensure the required characteristics. Moreover, since electrode layers have been formed by using screen printing technique in most cases, there has been a problem of worsening of the dimensional accuracy such as "blurring of printing." Accordingly, the conventional method is unable to reduce the electrode dimensions while maintaining high accuracy and is limited with respect to reduction in size of the filter.

SUMMARY OF THE INVENTION

The object of the present invention is to provide a small-sized radio frequency filter with which the desired frequency characteristic can be obtained with simple configuration even in higher frequency band.

The radio frequency filter of the present invention includes an inductor component, capacitor component, and resistor component, and has a configuration as follows.

A conductor pattern is formed on the surface of a dielectric layer, forming at least one of the inductor component, capacitance component and resistor component.

An adjusting layer is formed so as to cover at least a part of the conductor pattern and serves to adjust the frequency characteristic of the filter.

The conductor pattern is usually formed on the surface of dielectric layer, and sintered thereafter.

The present invention has the following features.

(1) Forming an adjusting layer with a dielectric material, it is possible to increase the frequency adjusting range by changing the effective dielectric constant.

(2) Forming an adjusting layer with a magnetic material, it is possible to increase the frequency adjusting range by changing the effective permeability.

(3) Forming a conductor on the top surface of adjusting layer formed of the dielectric material or magnetic material, it is possible to enhance the change of the effective dielectric constant or effective permeability.

(4) Grounding the adjusting layer in (3), it is possible to further enhance the change of the effective dielectric constant or effective permeability.

(5) Forming a dielectric layer between the conductor pattern and the adjusting layer, it is possible to prevent the breakdown or damage of electrodes not to be adjusted.

(6) The adjustment can be regulated by changing the area of the adjusting layer for each conductor pattern of the adjusting object.

(7) The frequency can be adjusted higher by removing a part of the adjusting layer.

(8) The frequency can be adjusted lower by adding a part of the adjusting layer thereon.

(9) The capacity value of the capacitor can be adjusted by forming at least a pair of interdigital electrodes in the conductor pattern.

(10) The inductance value of the inductor can be adjusted by forming the conductor pattern, making at least one of the line width and the line space thereof not more than 60 µm.

(11) Using intaglio-printing technique for forming the conductor pattern, it is possible to make the filter small-sized and adjustable.

(12) Using thin-film forming technique for forming the conductor pattern, it is possible to make the filter small-sized and adjustable.

The present invention having a configuration as described above may provide a small-sized radio frequency filter by which the desired frequency characteristic can be easily obtained with simple configuration even in a higher frequency band.

DESCRIPTION OF THE PREFERRED EMBODIMENT

The preferred embodiments of the present invention will be described in the following with reference to the drawings.

Embodiment 1

Figure 1:
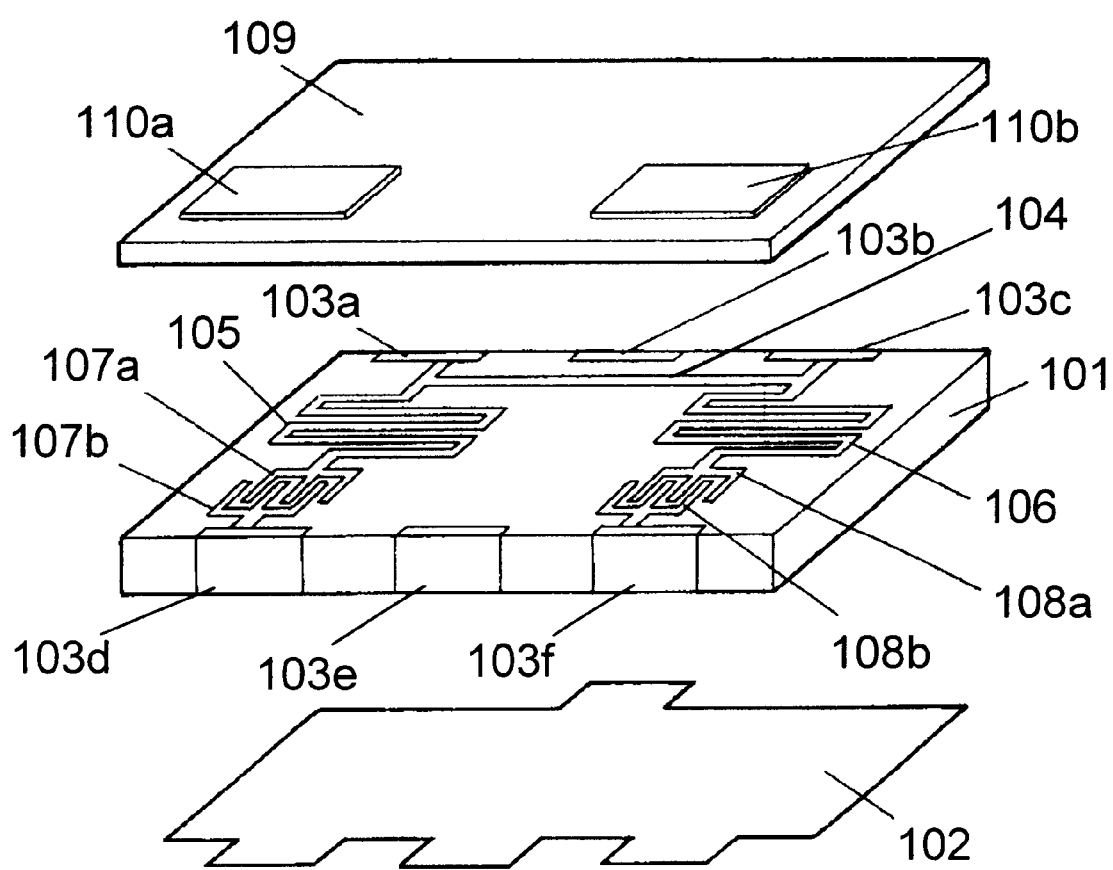
FIG. 1 is a configuration diagram of a radio frequency filter in the embodiment 1 of the present invention.

FIG. 1 is a configuration diagram of a radio frequency filter in the embodiment 1 of the present invention. In the radio frequency filter of the present embodiment, ground electrode 102 is formed on the under surface of dielectric 101, and terminal electrodes 103a, 103b, 103c, 103d, 103e, 103f are formed so as to go round the side of dielectric 101 and partly be routed to the top thereof. In addition, on the top surface of dielectric 101 are formed first transmission electrode 104, second transmission electrode 105, third transmission electrode 106, first interdigital electrode 107a/107b, and second interdigital electrode 108a/108b. Further, dielectric layer 109 is laminated on the upper side of these electrodes, on which adjusting dielectric layers 110a and 110b are respectively formed so as to be at least partly overlapped with first interdigital electrode 107a/107b and second interdigital electrode 108a/108b. One end of first transmission electrode 104 and one end of second transmission electrode 105 are connected to terminal electrode 103a. Moreover, one end of first interdigital electrode 107a is connected to the other end of second transmission electrode 105, and terminal electrode 103d is connected to the other electrode of first inter digital electrode 107b. Similarly, the other end of first transmission electrode 104 and one end of third transmission electrode 106 are connected to terminal electrode 103c. In addition, second interdigital electrode 108a is connected to the other end of third transmission electrode 106, and terminal electrode 103f is connected to third interdigital electrode 108b. Further, terminal electrodes 103b, 103d, 103e and 103f are all connected to ground electrode 102 for the purpose of grounding.

The operation of a radio frequency filter having a configuration as described above will be described in the following.

Interdigital electrodes 107a/107b are closely disposed without contacting each other. These operate as an interdigital capacitor whose capacity value is determined by the electrode dimension, the number of electrodes, the distance between electrodes, and the dielectric constant of dielectric 101. Interdigital electrodes 108a/108b works in the same way. Moreover, transmission electrode 105 operates as an inductor whose inductance is proportional to the characteristic impedance determined by the shape and dimension of the transmission line, and the dielectric constant of dielectric 101. Transmission electrode 106 works in the same constitution. More specifically, a serial resonator including transmission electrode 105 that operates as an inductor, and interdigital electrode 107a/107b that operates as a capacitor is connected in shunt to transmission line 104. Transmission electrode 106 and interdigital electrodes 108a/108b work in the same way. The serial resonator connected in shunt to the transmission line has an attenuation pole. Accordingly, the radio frequency filter of the present embodiment operates as a band-stop filter having two attenuation poles in which terminal electrode 103a and terminal electrode 103c respectively function as input terminal and output terminal.

Dielectric layer 109 protects each electrode formed on the top surface of dielectric 101, thereby preventing them from being broken down or damaged. Adjusting dielectric layers 110a and 110b are formed so as to cover interdigital electrodes 107a/107b and 108a/108b respectively. Accordingly, the effective dielectric constant of the portion covered becomes greater as compared with the portion not covered, causing their capacity values to become greater. Moreover, dielectric whose sintering temperature is lower than the sintering temperature for dielectric 101 and dielectric layer 109 is used as the material for adjusting dielectric layers 110a and 110b. In this way, the adjusting dielectric layer can be formed in the final sintering process. Accordingly, it becomes possible to adjust the frequency characteristic after manufacturing the radio frequency filter. As an example, in the case of using thermosetting resin, it has been experimentally confirmed that the interdigital capacitor is increased by 20% in capacity.

Embodiment 2

Figure 2:
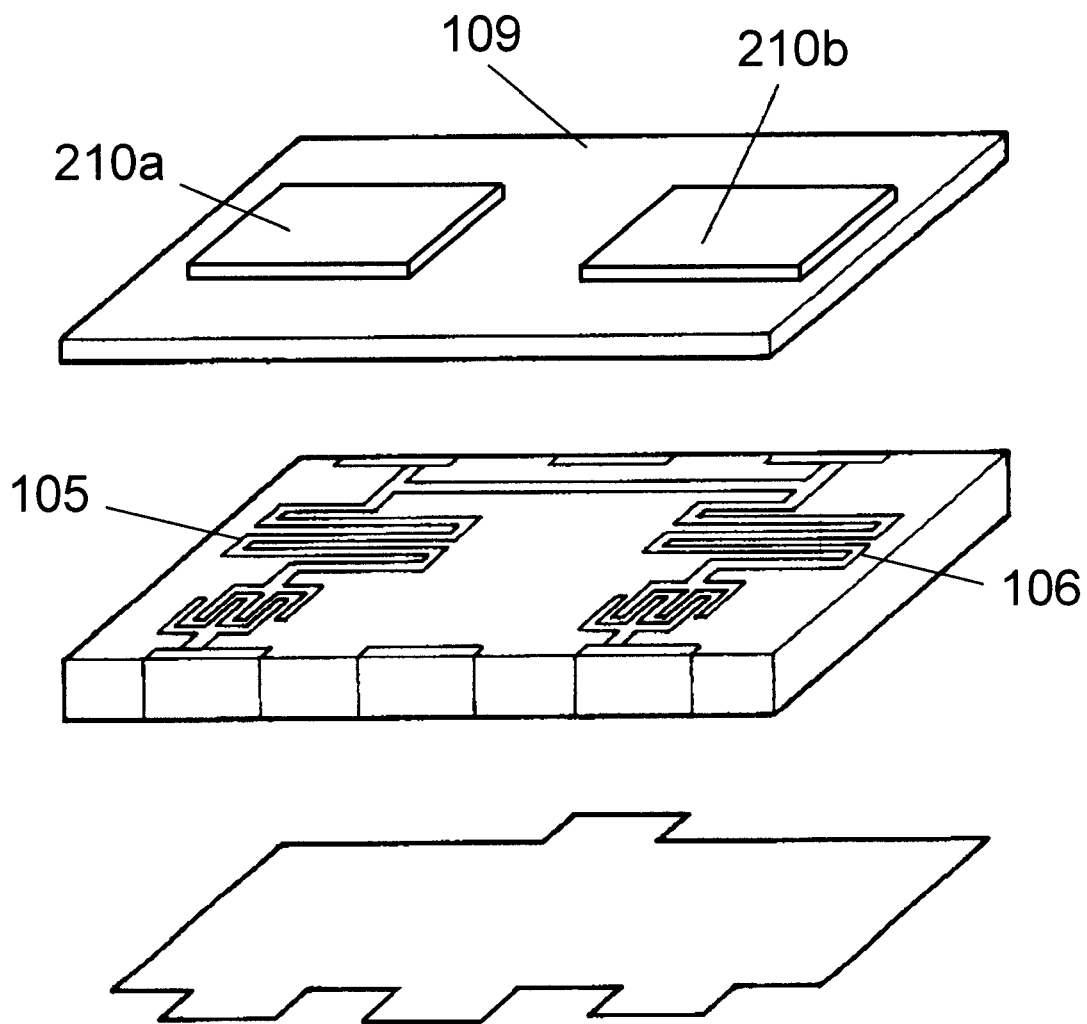
FIG. 2 is a configuration diagram of a radio frequency filter in the embodiment 2 of the present invention.

FIG. 2 is a configuration diagram of the radio frequency filter in the embodiment 2 of the present invention. The difference from the embodiment 1 of the radio frequency filter in the present embodiment is the forming position of the adjusting dielectric layer. In the present embodiment, adjusting dielectric layers 210a and 210b are formed so as to be overlapped with at least a part of transmission electrodes 105 and 106 on the top surface of dielectric layer 109 as shown in FIG. 2. In this case, the frequency characteristic of the radio frequency filter can be adjusted by changing the effective dielectric constant of these transmission electrodes, thereby adjusting the inductance value of the inductor.

In the case of the radio frequency filter of the present embodiment, an adjusting magnetic layer can be formed instead of an adjusting dielectric layer. In this case, it is possible to increase the inductance value adjustable range. In the case of the radio frequency filter of the embodiments 1 and 2, an adjusting conductor layer can be formed instead of an adjusting dielectric layer. Also in this case, it is possible to increase the capacity value or inductance value adjustable range.

Embodiment 3

Figure 3:
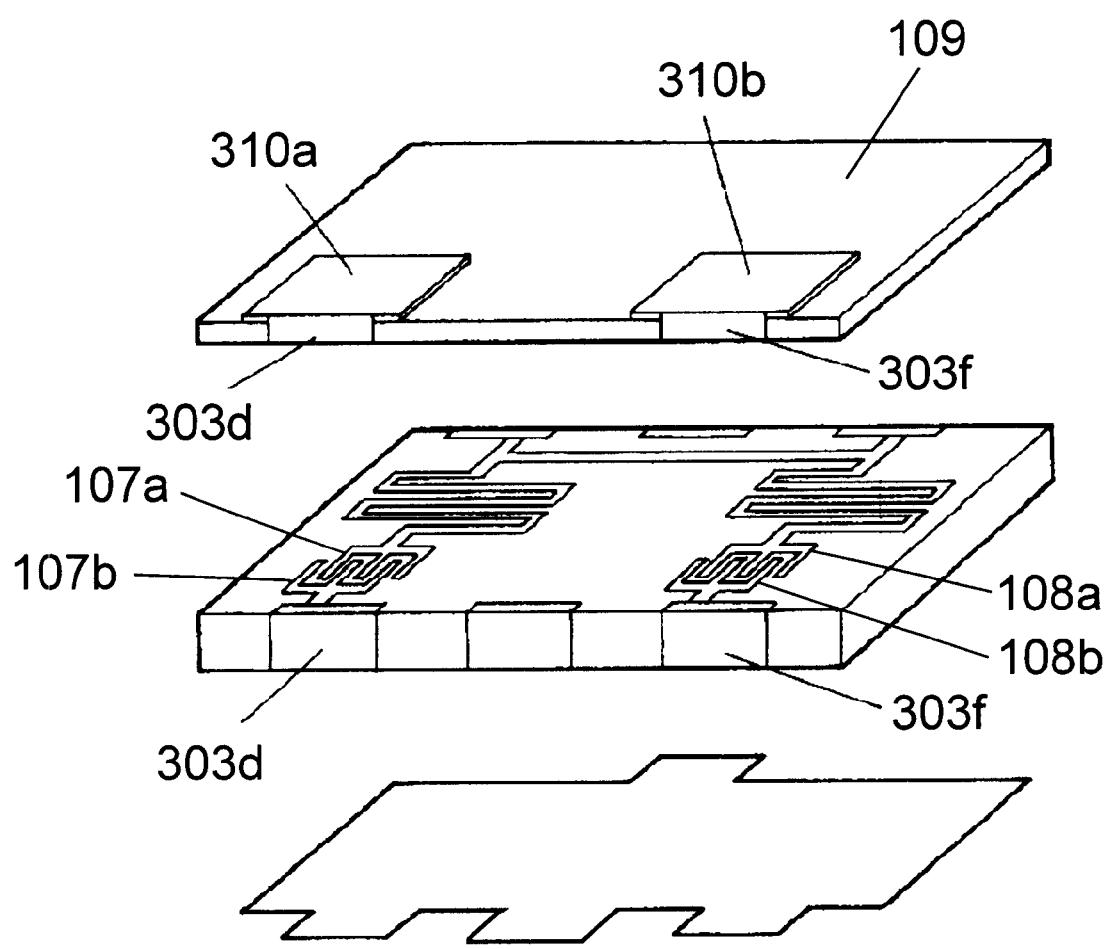
FIG. 3 is a configuration diagram of a radio frequency filter in the embodiment 3 of the present invention.

FIG. 3 is a configuration diagram of the radio frequency filter in the embodiment 3 of the present invention. In the radio frequency filter of the present embodiment, as shown in FIG. 3, adjusting conductor layers 310a and 310b are provided instead of the adjusting dielectric layers in the embodiment 1 which are grounded by using terminal electrodes 303d and 303f. Except the above, the configuration is in the same constitution as the embodiment 1. In FIG. 3, adjusting dielectric conductor layers 310a and 310b are formed on the interdigital electrodes, and the capacitances are added thereto in proportion to the area occupied by the interdigital electrode. Accordingly, it is possible to increase the capacitance value adjustable range.

Embodiment 4

Figure 4:
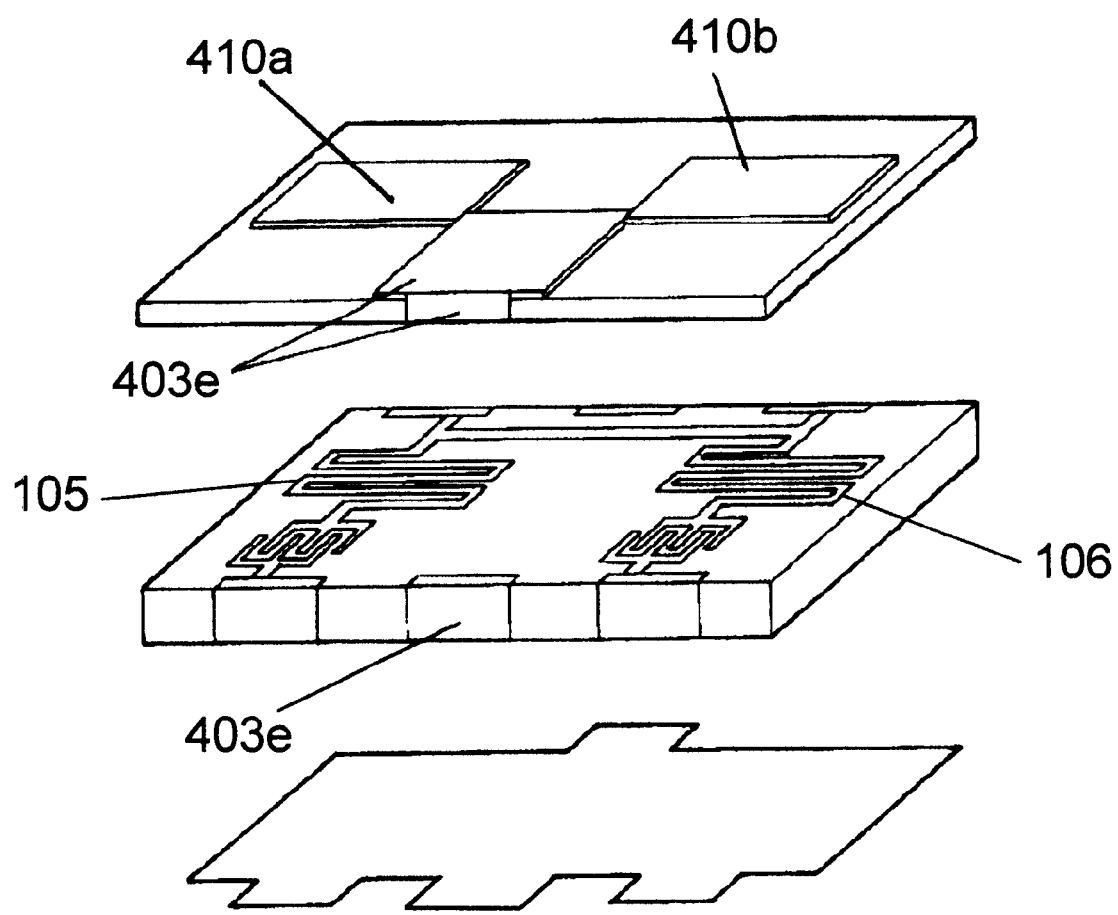
FIG. 4 is a configuration diagram of a radio frequency filter in the embodiment 4 of the present invention.
Figure 5:
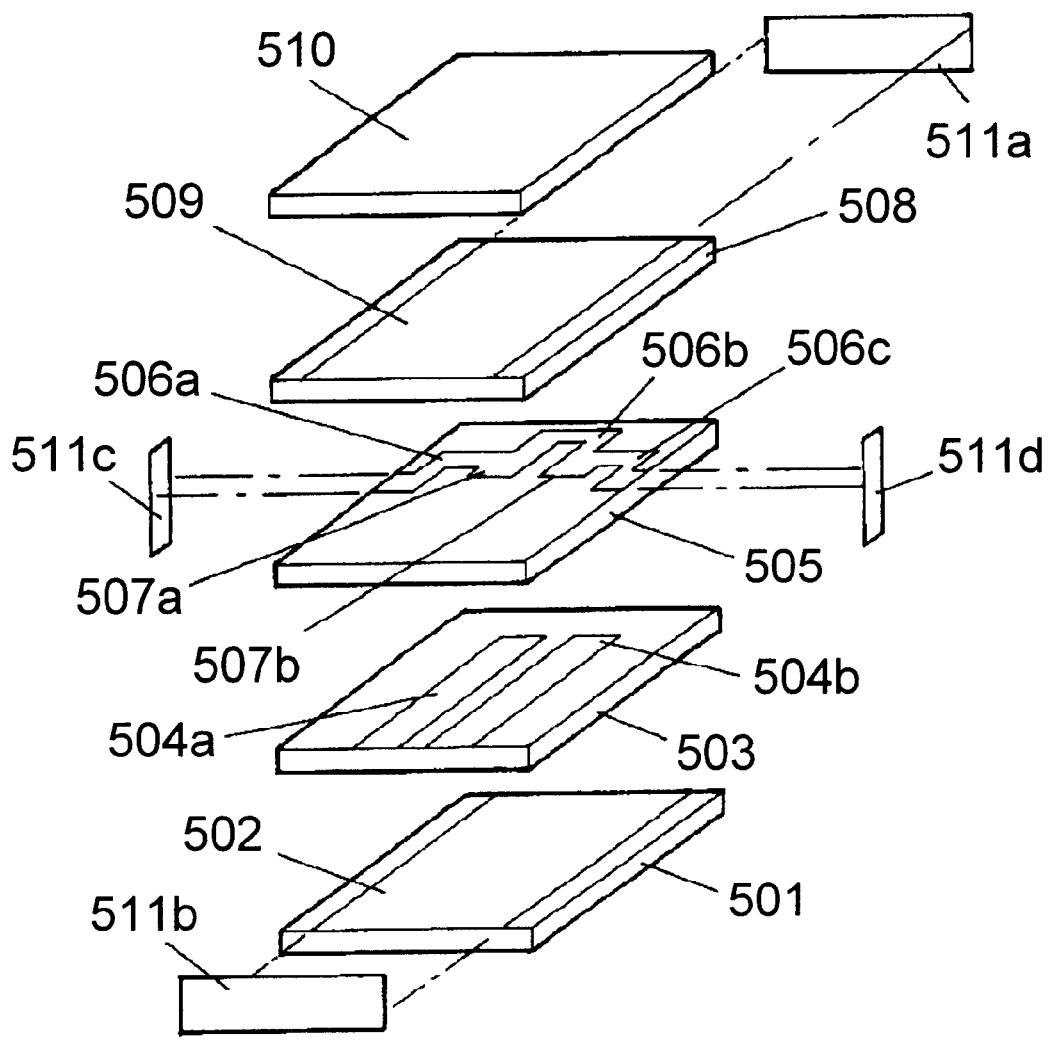
FIG. 5 is a configuration diagram of a radio frequency filter in a conventional example.

FIG. 4 is a configuration diagram of the radio frequency filter in the embodiment 4 of the present invention. In the radio frequency filter of the present embodiment, as shown in FIG. 4, instead of adjusting dielectric layers in the embodiment 2, adjusting conductor layers 410a and 410b are disposed so as to be at least partly overlapped with transmission electrodes 105 and 106 on the top surface of dielectric layer 109. Further, they are grounded by using grounding electrode 403e as shown in FIG. 4. The configuration other than the above is in the same constitution as that in the embodiment 2. In this case, transmission electrodes 105 and 106 are of triplate structure, and their electromagnetic field is concentrated between ground electrode 102 and conductor layers 410a and 410b. Accordingly, it is possible to increase the effective dielectric constant near transmission electrodes and to enlarge the inductance value adjustable range.

Figure 6:
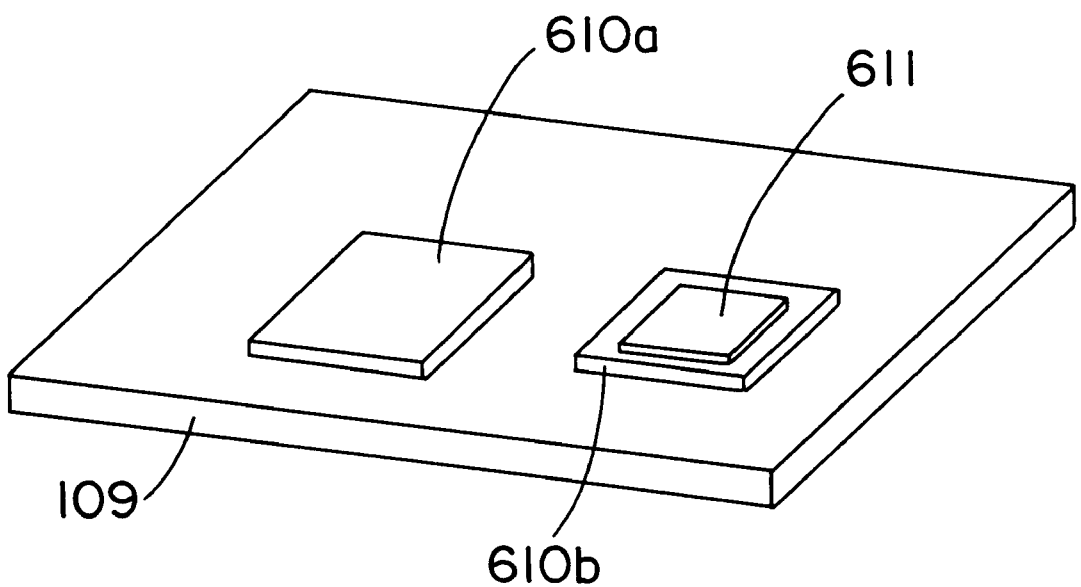
FIG. 6 is a configuration diagram of a radio frequency filter in the embodiment 5 of the present invention.

FIG. 6 is a configuration diagram of the radio frequency filter in the embodiment 5 of the present invention. In the radio frequency filter of the present embodiment, as shown in FIG. 6, adjusting layers 610a and 610b are disposed so as to be on the top surface of dielectric layer 109. Adjusting layers 610a and 619b may be either a dielectric material of a magnetic material. A conductor 611 may be formed on top of the adjusting layer 610b. In an alternative embodiment, a conductor 611 may be formed on top of the adjusting layer 610a. This embodiment may enhance the change of the effective dielectric constant or the effective permeability of the adjusting layer.

In each of the embodiments described above, it is also preferable to adjust the frequency by increasing or decreasing the area of the dielectric layer formed on the top surface of each electrode in order to protect the electrode. In this case, it is advantageous in that the radio frequency filter manufacturing processes may be reduced.

In addition, since the above radio frequency filter includes transmission electrodes and interdigital electrodes, it is possible to make the electrode layer in single layer and to manufacture the radio frequency filters by using intaglio-printing technique or thin-film forming technique. Accordingly, in the radio frequency filter of the present invention, each electrode can be formed so as for the line width and the line space to be not more than 60 μm. As a result, it is possible to make the radio frequency filter smaller and thinner as compared with a conventional radio frequency filter.

Further, in the serial resonator in each of the above embodiments, one end is connected to the transmission line between the input and output terminals, and the other end is grounded. Accordingly, the radio frequency filter in each of the embodiments operates as a band-stop filter. Further, with the addition of the conditions mentioned below, it is possible to allow the filter function as a filter other than a band-stop filter.

Since each of the two serial resonators has an attenuation pole, the impedance is capacitive when the frequency is lower than the resonance frequency and is inductive when higher. Accordingly, when the frequency is between both resonance frequencies, the reactance components of the two resonators cancel each other. In that case, the shapes and dimensions of second transmission electrode 105 and first interdigital electrodes 107a/107b, and third transmission electrode 106 and second interdigital electrodes 108a/108b are set so that the reactance components become zero or nearly zero. As a result, the radio frequency filter operates as a band-pass filter having a pass-band within the band between the two resonance frequencies.

In such a band-pass filter, it is possible to adjust the frequency characteristic of the filter after manufacturing the filter. Furthermore, in the manufacturing process of mobile communication equipment such as mobile phones, it is possible to adjust the frequency characteristic of the filter after assembling the circuit components. As a result, the yield can be improved with respect to the manufacture of the equipment.

The present invention having a configuration as described above provides a small-sized radio frequency filter by which the desired frequency characteristic can be obtained with a simple configuration even in higher frequency band.

What is claimed is:

1. A radio frequency filter, comprising:
    a first dielectric layer;
    a conductor pattern formed on a surface of said dielectric layer, having at least one of an inductor component and a capacitance component;
    a second dielectric layer formed as a top layer of the radio frequency filter; and
    an adjusting layer formed of one of a dielectric material and a magnetic material, formed on top of the second dielectric layer and formed so as to cover at least a part of said conductor pattern, for adjusting a frequency characteristic of said radio frequency filter.

2. The radio frequency filter of claim 1,
    wherein a conductor or adjusting the frequency characteristic of said radio frequency filter is formed on a top surface of said adjusting layer.

3. The radio frequency filter of claim 2,
    wherein said conductor is grounded.

4. The radio frequency filter of claim 1,
    wherein said second dielectric layer for protecting said conductor pattern is formed between said conductor pattern and said adjusting layer.

5. The radio frequency filter of claim 1,
    wherein an area of said adjusting layer is adjusted for each of said conductor pattern.

6. The radio frequency filter of claim 1,
    wherein the frequency characteristic is adjusted by removing at least a part of said adjusting layer therefrom.

7. The radio frequency filter of claim 1, wherein the frequency characteristic is adjusted by adding a part of said adjusting layer thereon.

8. The radio frequency filter of claim 1, wherein said conductor pattern has at least a pair of interdigital electrodes.

9. The radio frequency filter of claim 1, wherein at least one of a line width and a line space of said conductor pattern is not more than 60 μm.

10. The radio frequency filter of claim 1, wherein said conductor pattern is formed by an intaglio-printing technique.

11. The radio frequency filter of claim 1, wherein said conductor pattern is formed by an thin-film forming technique.

* * * * *